United States Patent [19]
Olson et al.

[11] Patent Number: 5,395,038
[45] Date of Patent: Mar. 7, 1995

[54] HIGH PLACEMENT ACCURACY WIRE BONDER FOR JOINING SMALL CLOSELY SPACED WIRING FEATURES

[75] Inventors: Stephen A. F. Olson, San Jose, Calif.; Benoit Ventimiglia, Poughkeepsie, N.Y.

[73] Assignee: International Business Machines Corporation, Armonk, N.Y.

[21] Appl. No.: 233,659

[22] Filed: Apr. 25, 1994

[51] Int. Cl.⁶ .......................................... H01C 21/60
[52] U.S. Cl. .................................. 228/180.5; 228/1.1; 228/4.5
[58] Field of Search .................. 228/110.1, 111, 180.5, 228/1.1, 4.5, 44.7; 156/73.1, 73.2, 494, 580.1

[56] References Cited
U.S. PATENT DOCUMENTS 4,619,397 10/1986 Urban .................................... 228/4.5
5,084,107 1/1992 Deguchi et al. ..................... 136/256
5,288,007 2/1994 Interrante et al. .................. 228/119

Primary Examiner—Samuel M. Heinrich
Attorney, Agent, or Firm—Aziz M. Ahsan

[57] ABSTRACT

An automated wire bonding tool for interconnecting circuit pads on microelectronic circuit devices and substrates. A single application of the bonding tool spans both bond sites with the wire being held under the bond tool and gripped at both ends while bonding the wire to both bond sites simultaneously and with high placement accuracy.

9 Claims, 7 Drawing Sheets

HIGH PLACEMENT ACCURACY WIRE BONDER FOR JOINING SMALL CLOSELY SPACED WIRING FEATURES

FIELD OF THE INVENTION

The present invention generally relates to automated wire bonding tools for interconnecting circuit pads on microelectronic circuit devices and substrates and, more particularly, to the interconnecting of closely spaced circuit pads of very small areas.

BACKGROUND OF THE INVENTION

As discussed in U.S. Pat. No. 5,288,007, issued to Mario J. Interrante et al. and assigned to the present assignee, the disclosure of which is incorporated herein by reference, the constant strive for increased circuit density on chips and modules has resulted in ever smaller electrical lines and circuit pads. The increased density and level of integration also have increased the probability that the electrical lines or circuit pathways may have to be rerouted after manufacture in order that the chips and modules be made free from defects, which are typically discovered during chip or module burn in or testing. It has become uneconomical simply to isolate or discard defective portions of a large scale integration (LSI) package because of the expensive manufacturing investments involved. The rerouting of circuit wires is done for a variety of reasons. One important reason, other than defect correction, is to customize a part for a particular performance requirement. Other reasons are discussed in the aforementioned patent.

The establishment of a post-manufacturing electrical connection between circuit pads for any of the foregoing reasons requires, of course, that the new connection itself be free of defects and that it be accomplished without disturbing the pre-existing sound circuits. To the end that defects in the new circuit connection be avoided, U.S. Pat. No. 5,288,007 also teaches that both ends of the new connection wire be established simultaneously with the respective circuit pads so that the establishment of a later pad bond does not deleteriously impact an earlier pad bond as is sometimes the case where the two ends of a single connection wire are bonded sequentially to respective pads.

Although the simultaneous connection technique was an important step forward, other problems remain to be solved. In particular, there is the problem of how to supply, handle and position the very fine wire that must be used in accomplishing the interconnecting of closely spaced circuit pads of very small areas.

PURPOSES AND SUMMARY OF THE INVENTION

One purpose of the present invention is to provide means for interconnecting closely spaced circuit pads of very small areas.

Another purpose of the invention is to supply, handle and position very small diameter wires with great precision.

A further purpose of the invention is to accurately position a very small diameter wire for the simultaneous bonding to its respective circuit pads.

An additional purpose of the invention is to hold a very small diameter wire so as to prevent wire roll-over prior to and during the simultaneous bonding to its respective circuit pads.

These and other purposes of the present invention, as will appear from a reading of the following specification, are achieved by the provision of a fixed circular structural member which acts as a rack gear and guide for two structural arms mounted thereon for rotation about a fixed center of rotation. The center of rotation is located at the foot print of a retractable bonding tool when in its bonding position.

Driven spur gears mounted on respective arms and engaging the rack gear of the circular member causes the arms to rotate about the aforementioned center of rotation. The bonding tool is supported at the end of an ultrasonic wire bonding horn assembly which is actuated to raise or lower the bonding tool. The wire to be bonded is supplied by a spool mounted on a first arm. The wire is payed out through a first wire guide and clamp fixed to the end of the first arm. The wire is also gripped by a second wire guide and clamp fixed to the end of the other or second arm. Both clamps are capable of moving along the wire. A multi-axis positionable table also is provided for positioning the workpiece which is to receive the wire bond and for raising the workpiece into engagement with the bonding tool.

Therefore, in one aspect this invention is a wire bonding tool comprising:
 a pair of arms,
 actuable means for rotating said arms about a common axis,
 a positionable bonding tool which is brought to said axis when said tool is in its bonding position,
 a source of wire,
 a wire guide and a wire clamp secured thereto and mounted at the end of each arm adjacent said axis,
 said wire passing through each said wire guide and clamp and said axis, and
 a positionable table supporting a workpiece having a pair of pads across which a segment of said wire is to be bonded,
 said bonding tool having a width sufficient to span the distance between said pads,
 said table supporting said workpiece beneath said tool so that said pads can be brought into contact with said wire segment and said tool when said tool is in said bonding position.

In another aspect the invention is a wire bonding tool comprising:
 a pair of arms,
 actuable means for rotating said arms about a common axis,
 a positionable bonding tool which is brought to said axis when said tool is in its bonding position,
 a source of wire,
 a wire guide and a wire clamp secured thereto and mounted at the end of each arm adjacent said axis,
 said wire passing through each said wire guide and clamp and said axis,
 a workpiece having a pair of pads across which a segment of said wire is to be bonded,
 said bonding tool having a width sufficient to span the distance between said pads, and
 a positionable table supporting said workpiece beneath said tool so that said pads can be brought into contact with said wire segment and said tool when said tool is in said bonding position.

In yet another aspect the invention is a method of bonding a wire simultaneously to a pair of pads using a bonding tool having a bonding surface sufficiently wide to span the distance between said pads comprising:

clamping said wire at both ends using a pair of clamps, moving said tool into engagement with one side of said wire intermediate said clamps, moving said clamps so as to bend said wire about said bonding surface, moving said pads so as to engage the other side of said wire at the location of said bonding surface, and bonding said wire to said bonding surface.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

This invention describes a wire bonding tool for interconnecting closely spaced circuit pads of very small area on microelectronic circuit devices and modules of high device density and level of integration. The tool comprises a circular segment member equipped with a rack gear and a wheel guide. Each of a pair of arms is drivably mounted on the circular segment by means of a spur gear and two idler wheels. The spur gear engages the rack gear and the idler wheels engage the wheel guides. The spur gears are driven to cause the rotation of the arms about an axis. A positionable bonding tool is brought to the axis when in its bonding position. The width of the bonding tool is sufficient to span the distance between the circuit pads. Each arm also has a wire guide and a wire clamp secured thereto and mounted at the end of the arm facing the axis.

Wire is threaded through the guides and clamps and passes through the axis. A positionable table supports a workpiece having a pair of pads across which a wire segment is to be bonded. The bonding tool is brought into contact with the wire, the arms are rotated so as to bend the wire upwards about the axis and the table is raised to bring the pads, wire segment and bonding tool into contact. Then, the bonding tool is energized to effect the bonding of the wire segment to the circuit pads. Excess wire is broken off by translating the wire guides and clamps away from the axis.

Figure 1:
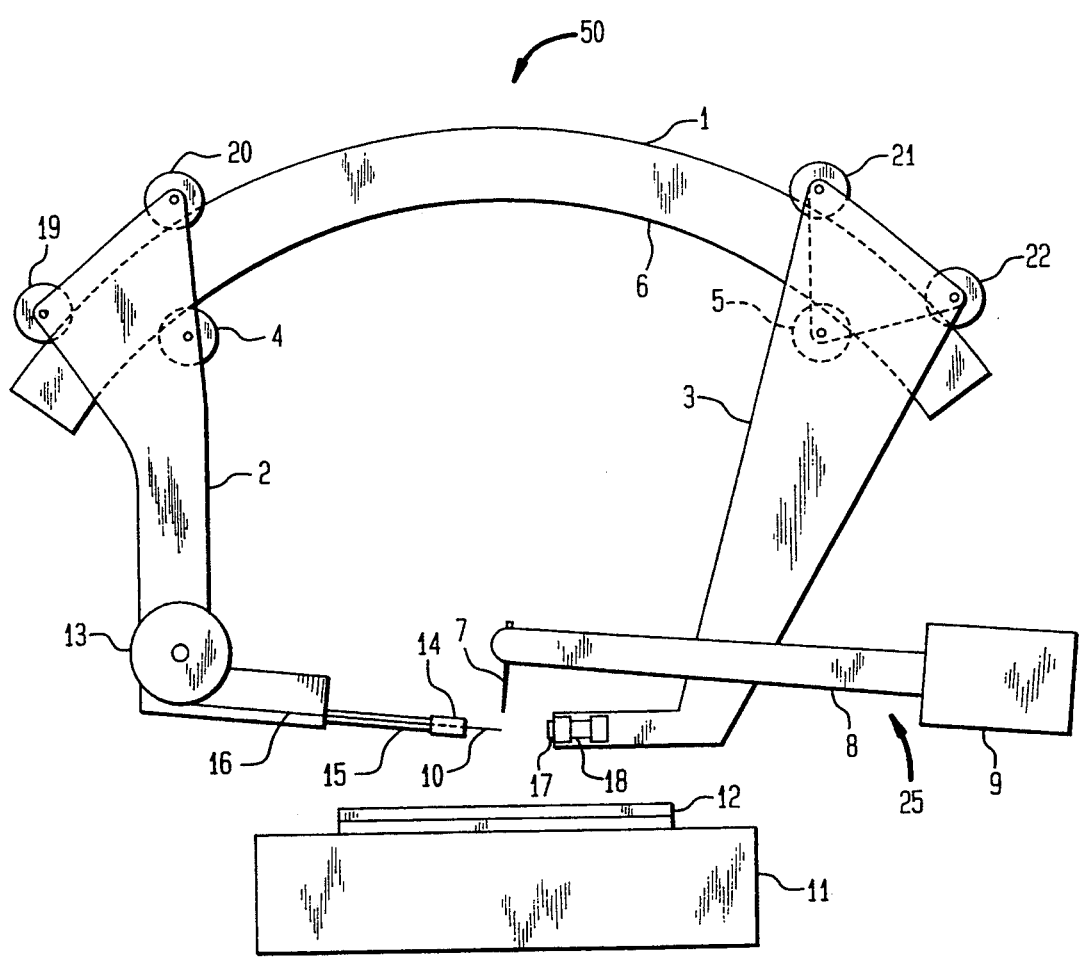
FIGS. 1–7 are simplified elevational views of the sequence of positions assumed by the wire bonding tool of the present invention at successive times during one cycle of operation.

FIG. 1 shows the structural elements of the wire bonding tool 50, of the present invention in their initial state or "home" position. Circular segment 1 is fixed to a conventional support frame (not shown) and acts as a rack gear and guide for arms 2 and 3. Arms 2 and 3 are guided for travel along segment 1 by respective ones of idler wheels 19–22. Spur gears 4 and 5 are driven by actuable motors (not shown) and are mounted on respective arms 2 and 3 while engaging the rack gear 6 of segment 1. The center of rotation of arms 2 and 3 (when they travel along segment 1 and consequently are rotated upon the actuation of the motors which drive gears 4 and 5), is located at the footprint of retractable bonding tool 7 when it is moved to its bonding position (not shown in FIG. 1).

Figure 2:
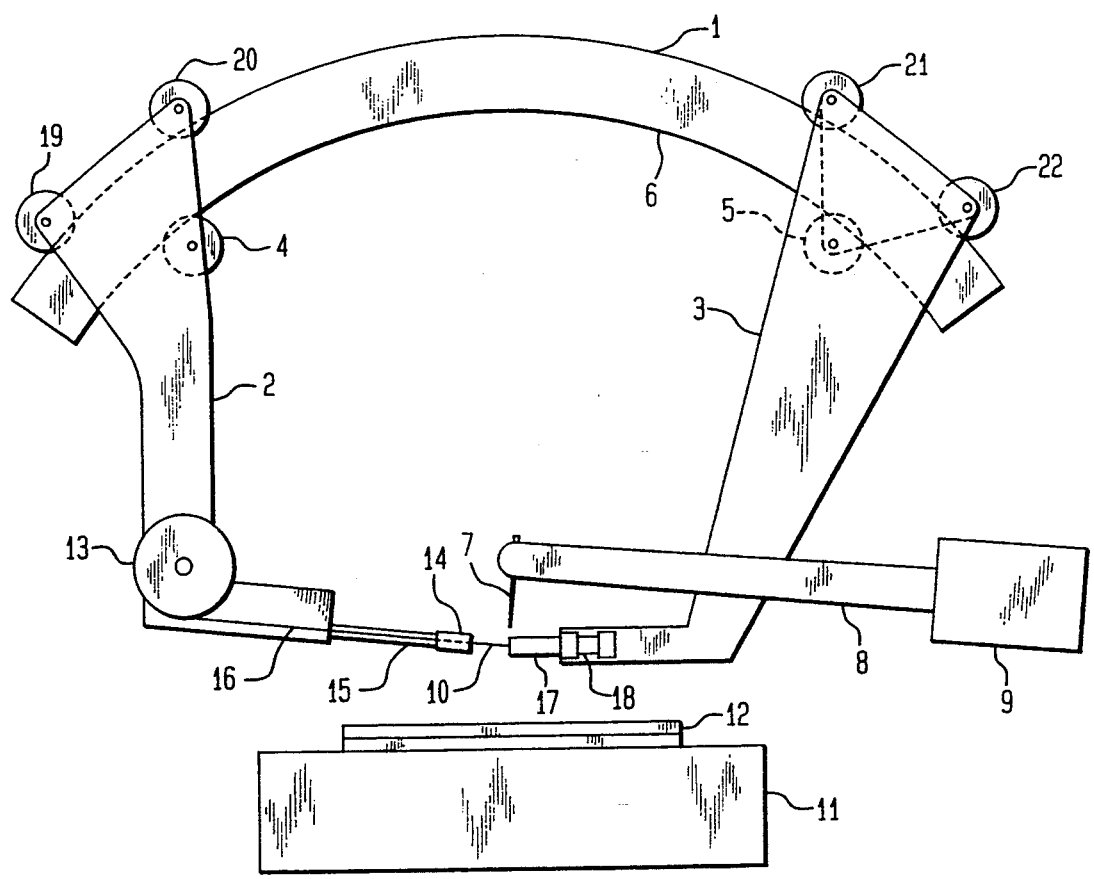

Bonding tool 7 is supported at the end of arm 8 which, in turn, is attached to bond horn and transducer 9 comprising an ultrasonic wire bonding system 25. Arm 8 is raised or lowered by bond horn 9 so that tool 7 is raised or lowered relative to axis 10 about which arms 2 and 3 rotate. A conventional multi-axis positionable table 11 carries workpiece 12 and locates the area to receive the wire to be bonded to the selected circuit pads (not shown) on the workpiece 12. Bonding tool 7 has a width sufficient to span the distance between said pads. Such a tool is shown in FIG. 5A of the aforementioned U.S. Pat. No. 5,288,007. Arm 2 supports wire spool 13, wire guide 15 and wire clamp 14 connected thereto. Guide 15 can be actuated to move clamp 14 towards or away from axis 10. Wire 16 is threaded through guide 15 and clamp 14 and protrudes from the latter sufficiently so that it can be captured by wire clamp 17 when it is thrust forward by wire guide 18 towards axis 10 upon the forward actuation of guide 18 as shown in FIG. 2. Clamp 17 is in the open position as it moves over wire 16 protruding from clamp 14. Clamp 17 then closes to hold the threaded end of the wire 16.

Figure 3:
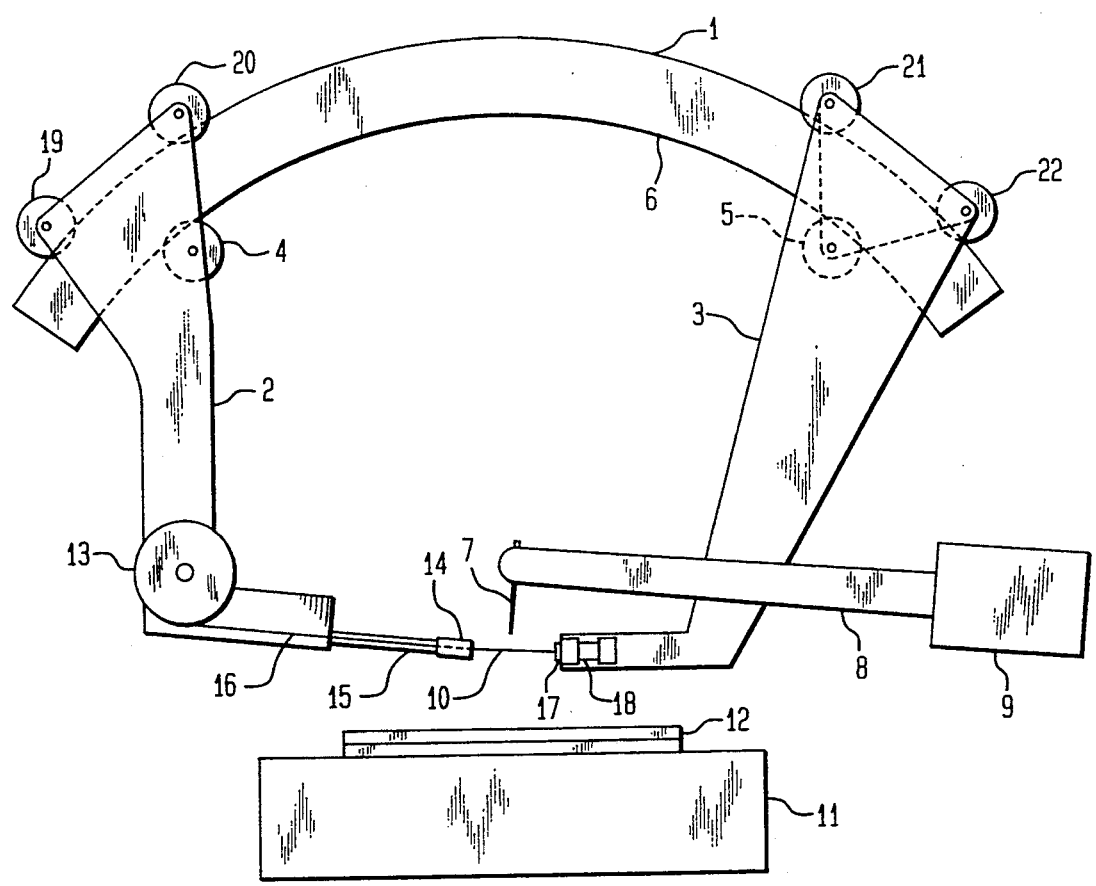
Figure 4:
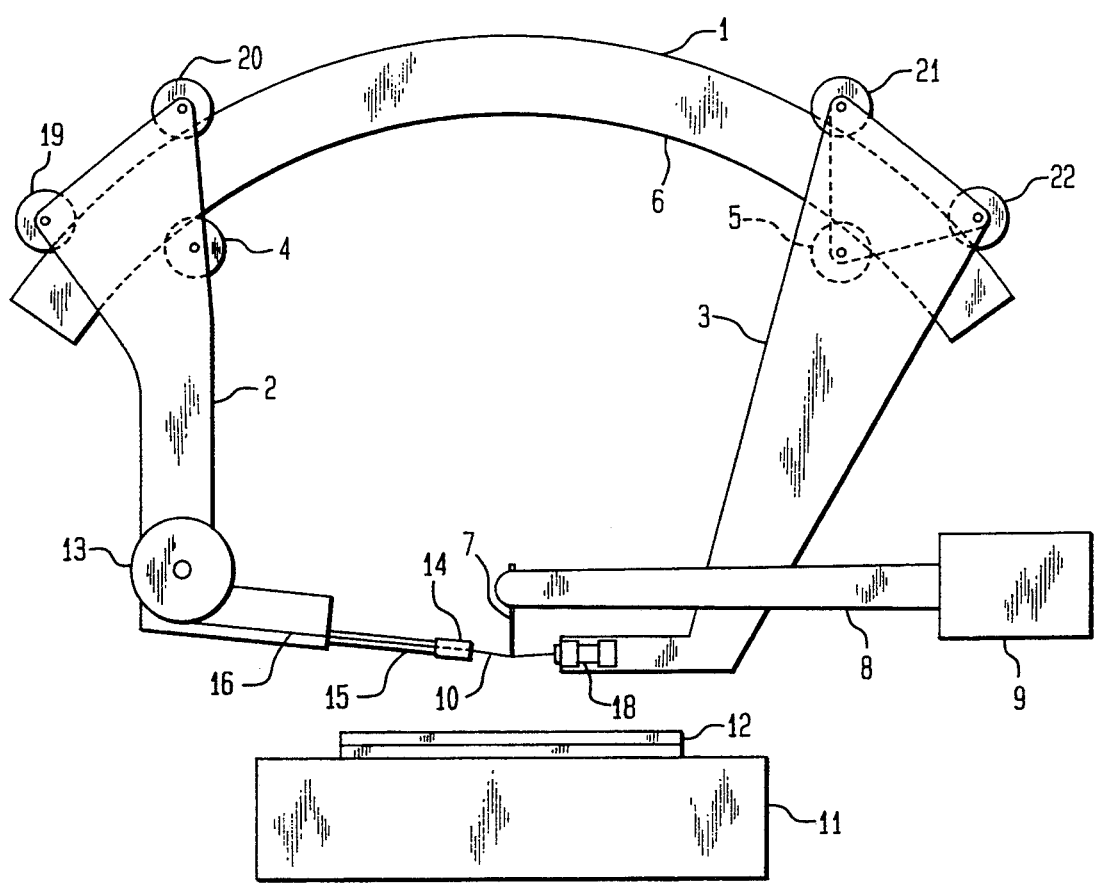

Clamp 17 is next withdrawn by the reverse actuation of guide 18 away from axis 10 as shown in FIG. 3. Wire 16 is now held at two places, i.e., by clamp 14 and by clamp 17 and traverses the location axis 10. Bonding tool 7 is lowered by bond horn 9 until the footprint of tool 7 slightly deflects wire 14, as shown in FIG. 4.

Bonding tool 7, as described in the aforementioned U.S. Pat. No. 5,288,007 is equipped with a groove which embraces wire 16 when the tool is brought into engagement with wire 16. By pressing tool 7 against wire 16 to slightly deflect the latter, a positive holding force is applied to wire 16 so that it does not roll-over prior to or during the later bonding operation and thereby prevent bonding action. This is an important factor of the present invention, especially when wire diameters are so small, for example, in the order of $18\mu$.

Figure 5:
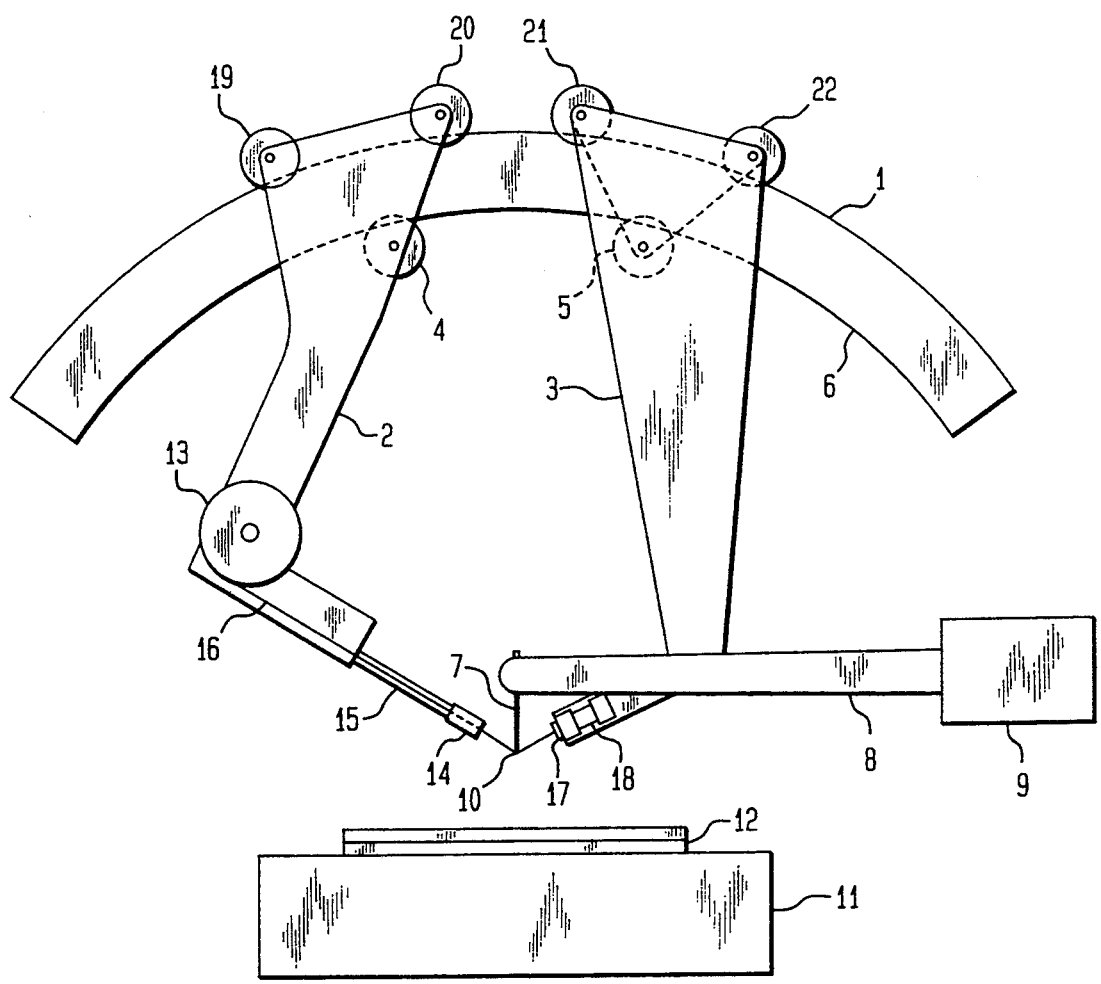
Figure 6:
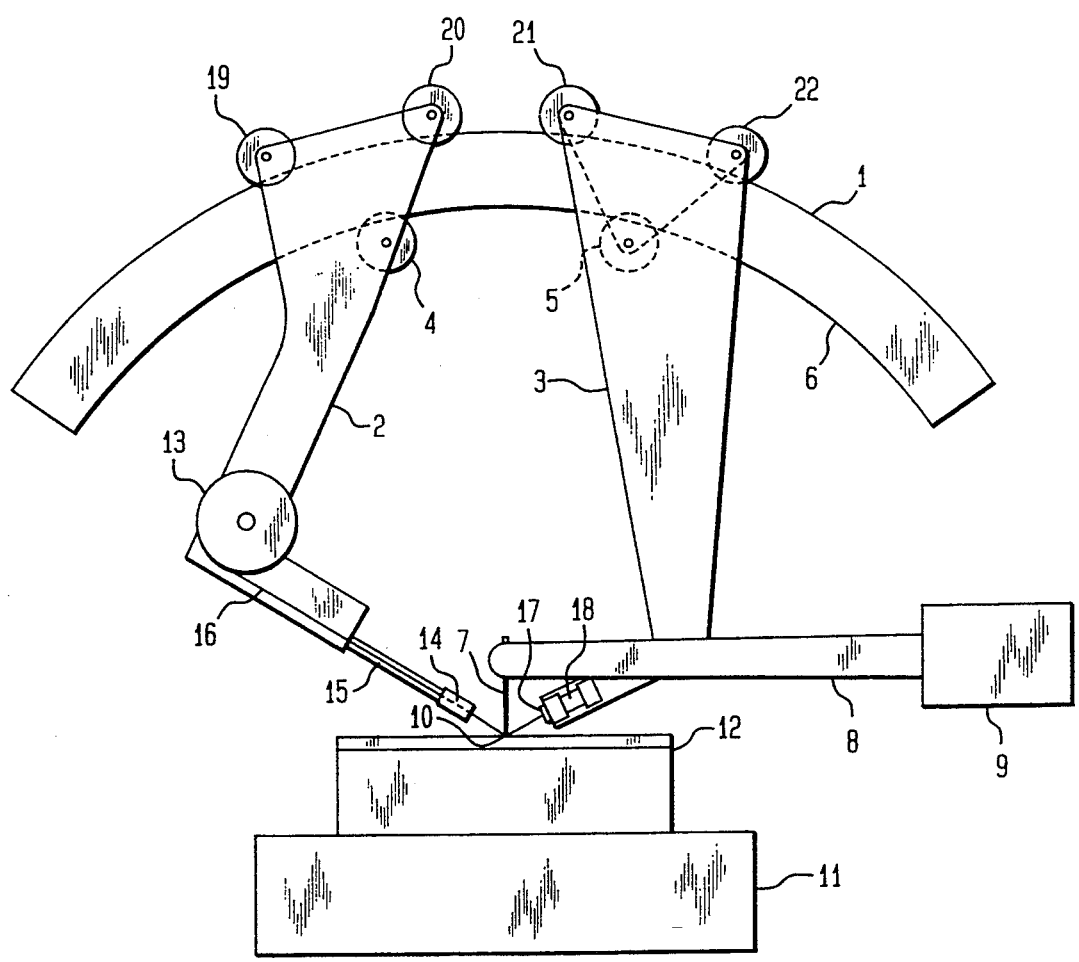
Figure 7:
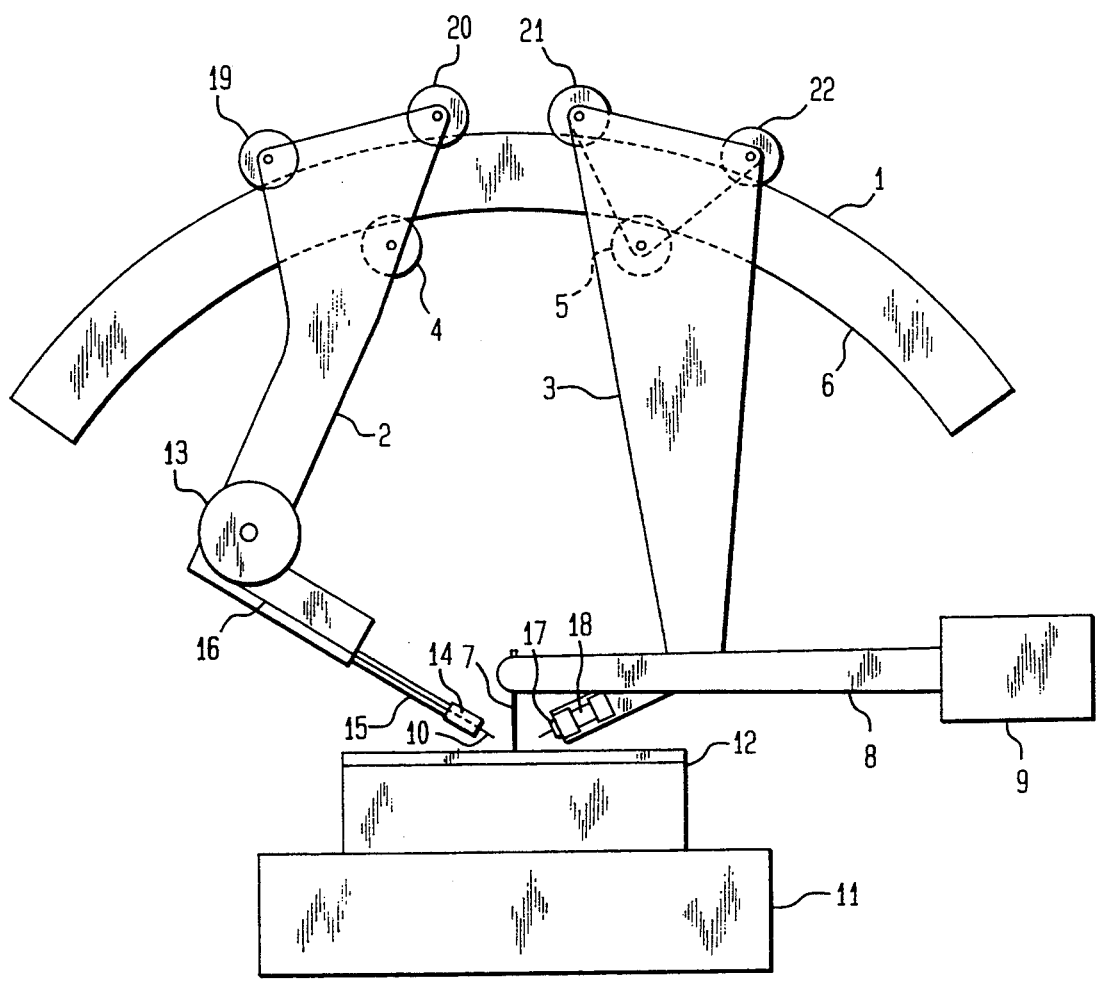

Referring now to FIG. 5, arms 2 and 3 are driven by gears 4 and 5 along rack gear 6 and are caused to rotate about axis 10, thus securely seating wire 16 in the groove of tool 7 while wrapping wire 16 around tool 7. The upward angle now assumed by wire 16 on both sides of axis 10 greatly facilitates the precise localization of wire 16 only at the desired circuits pads despite the crowded environment on workpiece 12. Wire 16 now is in position to be placed across the circuit pads which is accomplished, as shown in FIG. 6, by activating table 11 upward until there is a force or load from the bond tool pressing wire 16 against the pads. At this point, the bonding tool horn and transducer 9 are energized and wire 16 is ultrasonically bonded simultaneously to the selected circuit pads. Finally, clamps 14 and 17 while still gripping wire 16 are caused to move away from axis 10 by the translation of actuated guides 15 and 18 thus breaking wire 16 at the edges of the footprint of tool 7 and leaving the desired wire segment which is under the tool, as shown in FIG. 7. The wire fragment still remaining in wire clamp 17 is discarded as scrap. At the completion of this operation, all mechanisms are reset to their "home" positions of FIG. 1 and made ready for the next cycle of operation.

It can be seen from the preceding specification that the invention provides for great wire placement accuracy using an automated wiring tool of relatively uncomplicated design. With the disclosed mechanism, a single application of the bonding tool spans both bond sites with the wire being held under the bond tool and gripped at both ends. Gripping a length of wire to span both bond sites while centering the bond tool on the wire and bonding the wire to the bond sites provides high placement accuracy over the entire length of the bonded wire. In addition, using a single tool to span both sites provides for tight control of wire height which is an important requirement in many applications.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A wire bonding tool comprising:
    a pair of arms,
    actuable means for rotating said arms about a common axis,
    a positionable bonding tool which is brought to said axis when said tool is in its bonding position,
    a source of wire,
    a wire guide and a wire clamp secured thereto and mounted at the end of each arm adjacent said axis,
    said wire passing through each said wire guide and clamp and said axis, and
    a positionable table supporting a workpiece having a pair of pads across which a segment of said wire is to be bonded,
    said bonding tool having a width sufficient to span the distance between said pads,
    said table supporting said workpiece beneath said tool so that said pads can be brought into contact with said wire segment and said tool when said tool is in said bonding position.

2. A wire bonding tool comprising:
    a pair of arms,
    actuable means for rotating said arms about a common axis,
    a positionable bonding tool which is brought to said axis when said tool is in its bonding position,
    a source of wire,
    a wire guide and a wire clamp secured thereto and mounted at the end of each arm adjacent said axis,
    said wire passing through each said wire guide and clamp and said axis,
    a workpiece having a pair of pads across which a segment of said wire is to be bonded,
    said bonding tool having a width sufficient to span the distance between said pads, and
    a positionable table supporting said workpiece beneath said tool so that said pads can be brought into contact with said wire segment and said tool when said tool is in said bonding position.

3. The tool defined in claim 2 wherein said bonding tool is provided with a groove for embracing said wire and further including means for bringing said bonding tool to its bonding position whereby said wire segment is embraced by said groove prior to said table being positioned to bring said pads, said wire segments and said tool into contact.

4. The tool defined in claim 3 and further including means for actuating said rotating means so as to rotate said arms subsequent to bringing said bonding tool to its bonding position but prior to positioning said table to bring said pads, said wire segment and said tool into contact.

5. The tool defined in claim 4 and further including means for energizing said tool to effect bonding after said table is positioned to bring said pads, said wire segment and said tool into contact.

6. The tool defined in claim 5 and further including means for translating each of said wire guides and their respective wire clamps in a direction away from said axis so as to break said wire beyond said pads after said bonding is effected.

7. The tool defined in claim 2 wherein said actuable means for rotating said arms comprises:
    a circular segment member having a rack gear and a wheel guide, and
    an actuable spur gear and idler wheels fixed to each arm,
    each said spur gear engaging said rack gear and each of said wheels engaging said wheel guide,
    said arms being rotated about said axis when said spur gears are actuated.

8. A method of bonding a wire simultaneously to a pair of pads using a bonding tool having a bonding surface sufficiently wide to span the distance between said pads comprising:
    clamping said wire at both ends using a pair of clamps,
    moving said tool into engagement with one side of said wire intermediate said clamps,
    moving said clamps so as to bend said wire about said bonding surface,
    moving said pads so as to engage the other side of said wire at the location of said bonding surface, and
    bonding said wire to said bonding surface.

9. The method defined in claim 8 and further comprising breaking said wire by pulling said clamps opposingly after said bonding is completed.

* * * * *